United States Patent
Lee et al.

(10) Patent No.: US 7,671,469 B2
(45) Date of Patent: Mar. 2, 2010

(54) SIGE DEVICE WITH SIGE-EMBEDDED DUMMY PATTERN FOR ALLEVIATING MICRO-LOADING EFFECT

(75) Inventors: Tung-Hsing Lee, Taipei County (TW); Ming-Tzong Yang, Hsinchu County (TW); Tao Cheng, Hsinchu (TW); Ching-Chung Ko, Hsinchu County (TW); Tien-Chang Chang, Hsinchu (TW); Yu-Tung Chang, Hsinchu (TW)

(73) Assignee: Mediatek Inc., Hsin-Chu (TW)

( * ) Notice: Subject to any disclaimer, the term of this patent is extended or adjusted under 35 U.S.C. 154(b) by 117 days.

(21) Appl. No.: 11/967,264

(22) Filed: Dec. 31, 2007

(65) Prior Publication Data

US 2009/0166676 A1    Jul. 2, 2009

(51) Int. Cl.
*H01L 23/52* (2006.01)

(52) U.S. Cl. .................... 257/743; 257/213

(58) Field of Classification Search .......... 257/203, 257/207, 208, 213, 288, 374, 459, 503, 743, 257/E29.193
See application file for complete search history.

(56) References Cited

U.S. PATENT DOCUMENTS

| 6,384,464 | B1 * | 5/2002 | Shin ................... 257/503 |
| 6,693,315 | B2 * | 2/2004 | Kuroda et al. ........... 257/288 |
| 7,473,623 | B2 * | 1/2009 | Chen et al. ............. 438/585 |
| 2005/0082577 | A1 * | 4/2005 | Usui .................... 257/211 |
| 2005/0212136 | A1 * | 9/2005 | Karasawa et al. ........ 257/758 |
| 2006/0163665 | A1 * | 7/2006 | Chuang et al. ........... 257/374 |

* cited by examiner

*Primary Examiner*—Leonardo Andújar
*Assistant Examiner*—Jordan Klein
(74) *Attorney, Agent, or Firm*—Winston Hsu

(57) ABSTRACT

A semiconductor device with dummy patterns for alleviating micro-loading effect includes a semiconductor substrate having thereon a middle annular region between an inner region and an outer region; a SiGe device on the semiconductor substrate within the inner region; and a plurality of dummy patterns provided on the semiconductor substrate within the middle annular region. At least one of the dummy patterns contains SiGe.

13 Claims, 6 Drawing Sheets

SIGE DEVICE WITH SIGE-EMBEDDED DUMMY PATTERN FOR ALLEVIATING MICRO-LOADING EFFECT

BACKGROUND OF THE INVENTION

1. Field of the Invention

The present invention relates generally to the field of semiconductor integrated circuits and, more particularly, to an improved SiGe device with SiGe-embedded dummy pattern that encircles the SiGe device, which is capable of alleviating the micro-loading effect during the epitaxial growth of SiGe.

2. Description of the Prior Art

As known in the art, stress can be introduced in the channel region of a MOS transistor to increase carrier mobility, thereby enhancing the performance of the MOS transistor. Generally, it is desirable to induce tensile stress in the channel region of an NMOS device in a source-to-drain direction, and to induce compressive stress in the channel region of a PMOS device in a source-to-drain direction. Typically, to induce compressive stress in the channel region of a PMOS transistor, epitaxially grown SiGe (also referred to as SiGe stressor) is formed in the source and drain regions of the PMOS devices. Since SiGe has a greater lattice constant than silicon, it expands after annealing and induces compressive stress to the channel region in a source-to-drain direction.

However, the conventional SiGe technology suffers from the influence of micro-loading effect, which occurs due to a difference in pattern densities on a single die. The micro-loading effect leads to variation of epitaxial growth rates between a region of a higher density and a region of a lower density. Due to the difference in growth rates, the thickness of the resulting SiGe film becomes non-uniform. In addition, the composition of the epitaxial SiGe stressor in an isolated active region usually differs from that in a densely packed active region. Such non-uniformities may alter the stress level of the epitaxial SiGe stressor and adversely affect device performance.

Accordingly, there is a strong need in this industry to provide an improved SiGe device and method for alleviating the micro-loading effect, while at the same time overcoming the deficiencies of the prior art.

SUMMARY OF THE INVENTION

It is one object of the present invention to provide an improved SiGe device with specially designed SiGe-embedded dummy pattern that encompasses the SiGe device, which is capable of alleviating the micro-loading effect during the epitaxial growth of SiGe.

According to the claimed invention, a semiconductor device with dummy patterns for alleviating micro-loading effect comprises a semiconductor substrate having thereon a middle annular region between an inner region and an outer region; a SiGe device on the semiconductor substrate within the inner region; and a plurality of first dummy patterns provided on the semiconductor substrate within the middle annular region. At least one of the first dummy patterns contains SiGe.

From one aspect of this invention, a semiconductor device comprises a semiconductor substrate having thereon a middle annular region between an inner region and an outer region; a SiGe device on the semiconductor substrate within the inner region; a plurality of SiGe-embedded, cell-like dummy patterns provided on the semiconductor substrate within the middle annular region, wherein each of the SiGe-embedded, cell-like dummy patterns has substantially the same structure as that of the SiGe device; and a plurality of SiGe-free, cell-like dummy patterns in the outer region.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DETAILED DESCRIPTION

This invention pertains to an improved SiGe device with SiGe-embedded dummy patterns encompassing the SiGe device, which is capable of alleviating or counteracting the micro-loading effect during the epitaxial growth of SiGe. Such SiGe device may be a circuit component of mixed-signal circuits, RF circuits or analog circuits, and is usually designed as an isolated component in order to avoid coupling effect.

Figure 1:
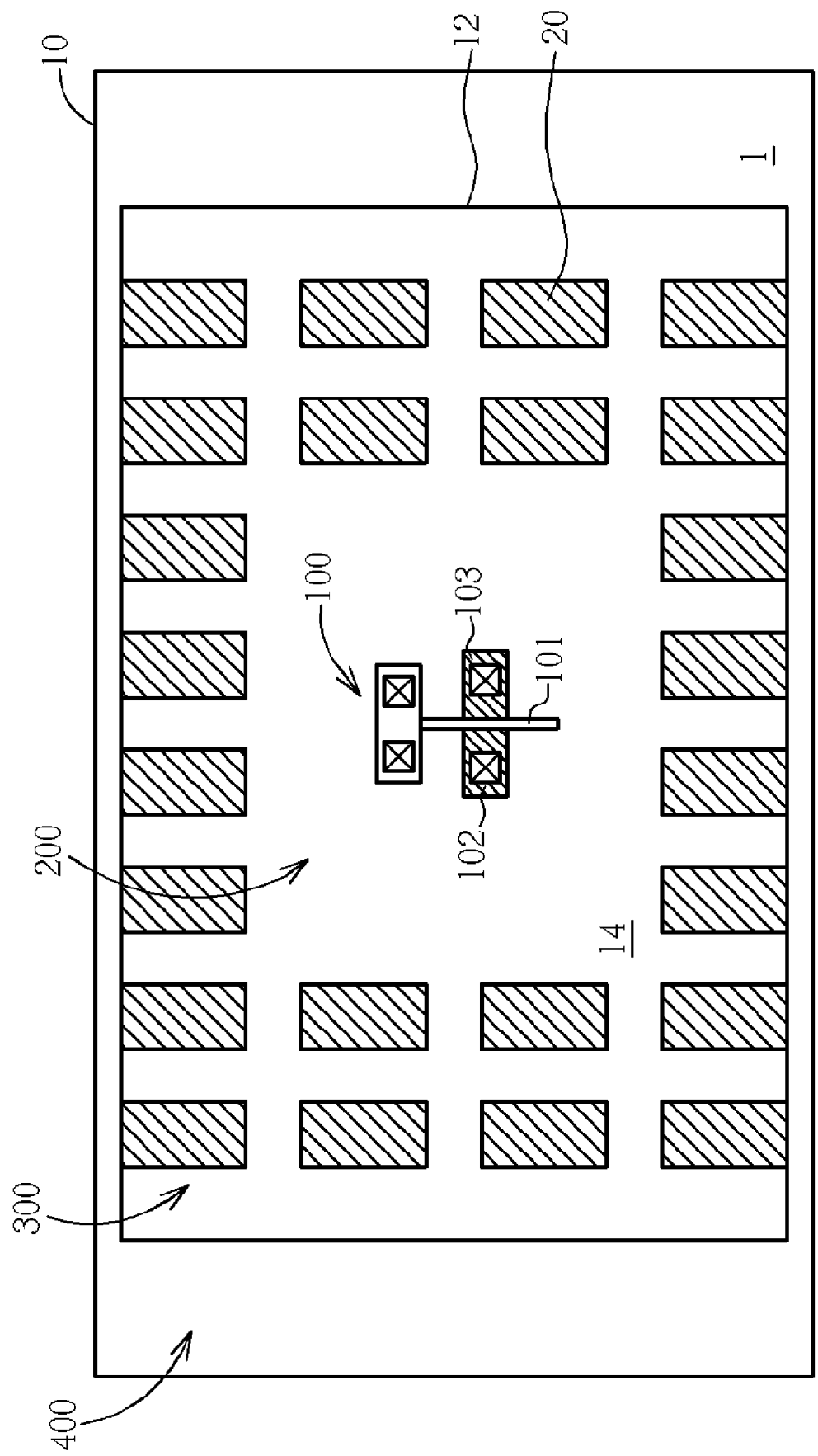
FIG. 1 is a schematic top view showing the layout of the SiGe device and SiGe dummy pattern in accordance with the first preferred embodiment of this invention.

FIG. 1 is a schematic top view showing the layout of the SiGe device and SiGe dummy pattern in accordance with the first preferred embodiment of this invention. As shown in FIG. 1, a SiGe device 100 is formed in an isolated region 10 of a substrate 1. The substrate 1 may be a silicon substrate, silicon-on-insulator (SOI) substrate or other suitable semiconductor substrates. The SiGe device 100 may include but not limited to P-channel metal-oxide-semiconductor (PMOS) transistors or bipolar junction transistors. By way of example, the SiGe device 100 is a PMOS transistor and comprises a gate stack 101, a $P^+$ source diffusion region 102 and a $P^+$ drain diffusion region 103.

An N well 12 is formed in the isolated region 10 of a substrate 1, wherein the SiGe device 100 is fabricated within the N well 12. Both of the $P^+$ source diffusion region 102 and the $P^+$ drain diffusion region 103 contain an epitaxially grown SiGe stressor layer. Shallow trench isolation (STI) 14 is formed in the substrate 1 to electrically isolate the SiGe device 100.

Typically, the steps before growing the SiGe stressor layer in the source and drain regions include forming a gate stack on a semiconductor substrate, forming spacers on sidewalls of the gate stack, and forming recesses in the silicon substrate along gate spacers. Then the SiGe stressor layer may be epitaxially grown in the recesses and annealed. The SiGe stressor layer may be formed by any suitable methods known in the art, for example, selective epitaxial growth (SEG) methods.

To effectively counteract the micro-loading effect of SiGe growth, a plurality of SiGe dummy patterns 20 are added to a middle annular region 300. The middle annular region 300 is between an inner region 200 and an outer region 400, wherein the SiGe device 100 is disposed within the inner region 200. The SiGe dummy patterns 20 surround the SiGe device 100. The SiGe dummy patterns 20 are active areas, which are defined concurrently with the active area or oxide define (OD) region of the SiGe device 100. SiGe is grown in these active areas concurrently with the SiGe stressor layer grown in the P+ source diffusion region 102 and the P+ drain diffusion region 103 of the SiGe device 100.

Figure 2:
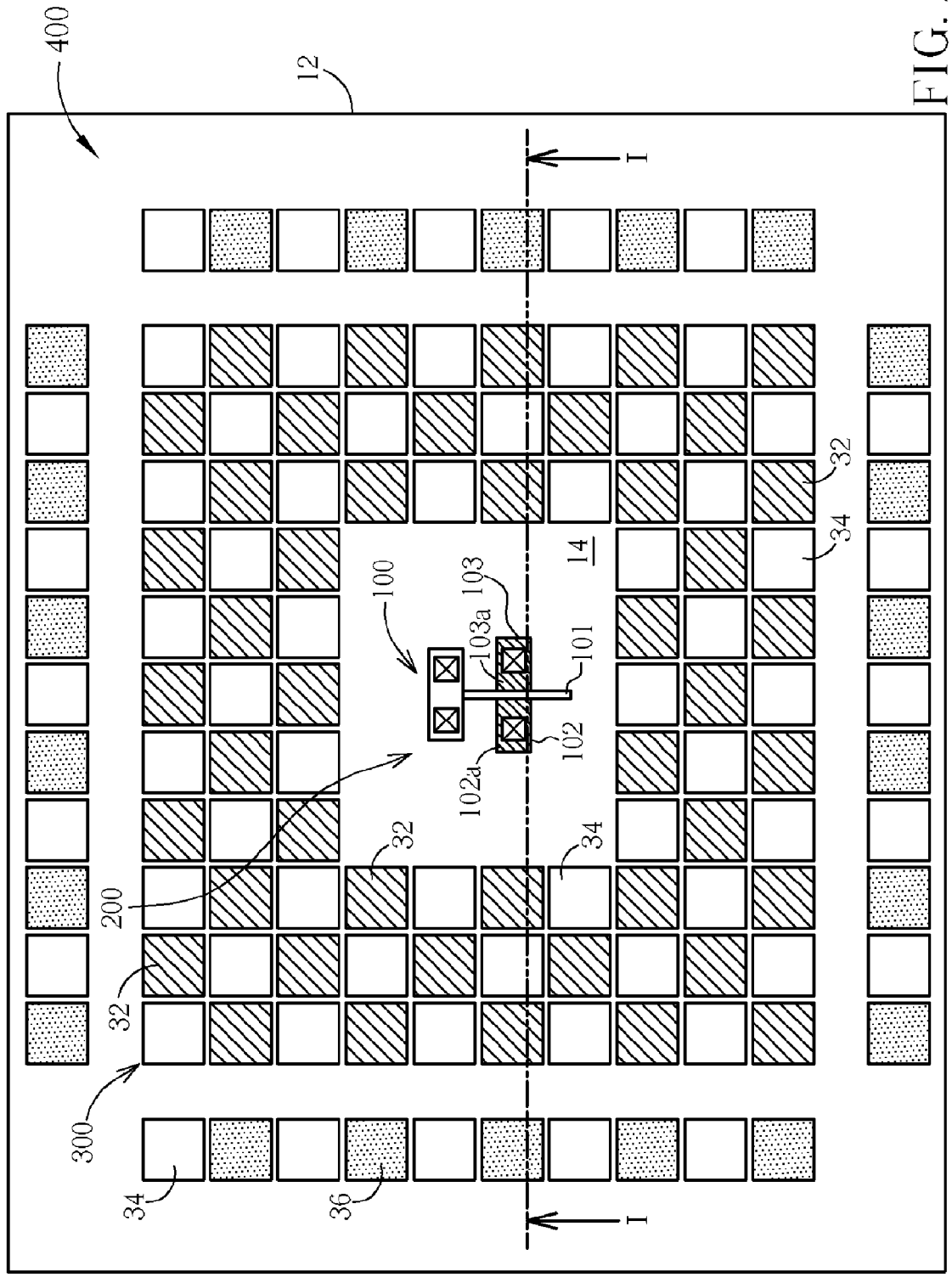
FIG. 2 is a schematic top view showing the layout of the SiGe device and SiGe-embedded dummy pattern in accordance with the second preferred embodiment of this invention.
Figure 3:
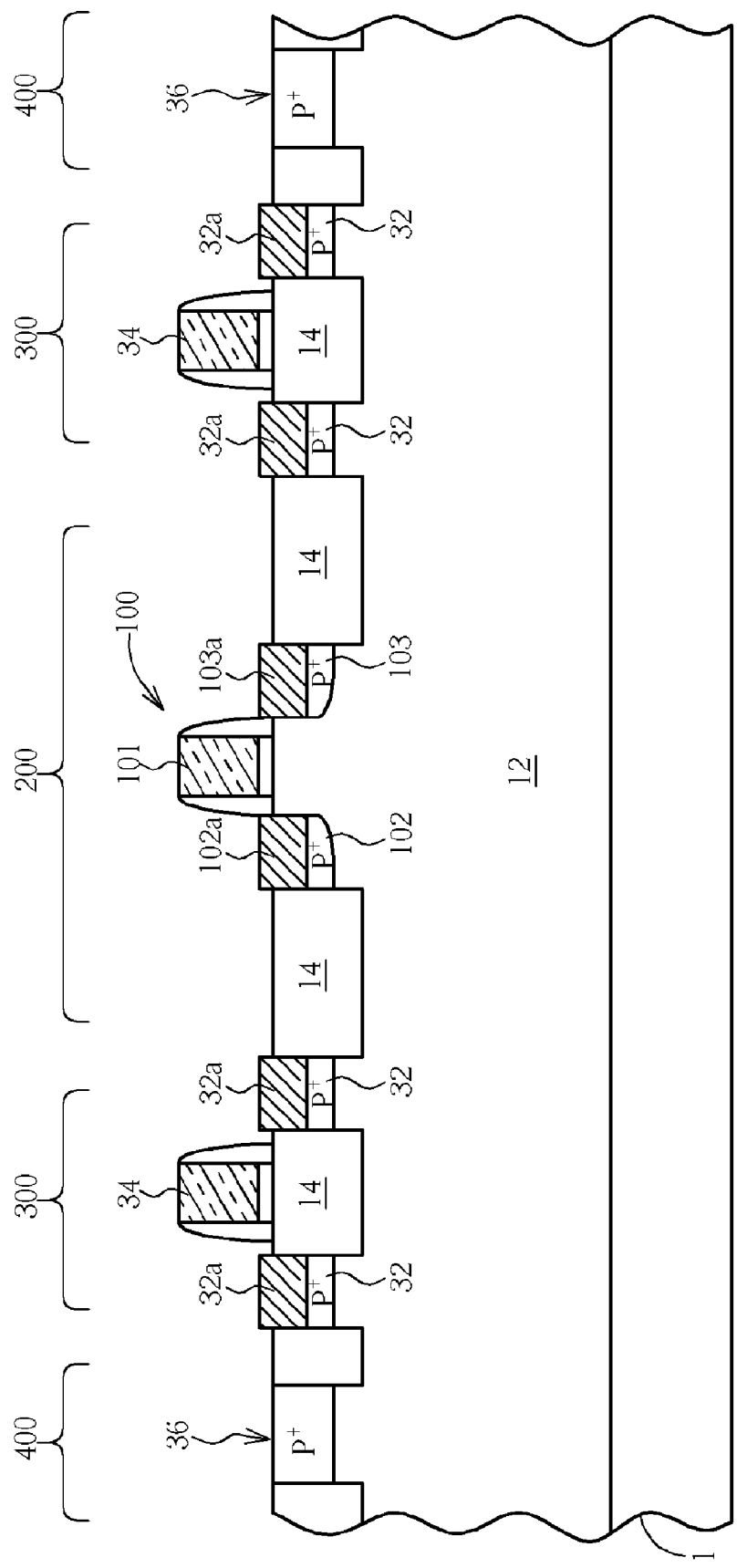
FIG. 3 is a schematic, cross-sectional view taken along line I-I of FIG. 2.

Please refer to FIG. 2 and FIG. 3. FIG. 2 is a schematic top view showing the layout of the SiGe device and SiGe-embedded dummy pattern in accordance with the second preferred embodiment of this invention, and FIG. 3 is a schematic, cross-sectional diagram taken along line I-I of FIG. 2, wherein like numeral numbers designate like regions, elements or layers.

As shown in FIG. 2 and FIG. 3, likewise, a SiGe device 100 is formed in an N well 12 of a substrate 1. The substrate 1 may be a silicon substrate, silicon-on-insulator (SOI) substrate or other suitable semiconductor substrates. According to the second preferred embodiment, the SiGe device 100 may include but not limited to a PMOS transistor and comprises a gate stack 101, a P+ source diffusion region 102 and a P+ drain diffusion region 103. A SiGe stressor layer 102a is formed on the P+ source diffusion region 102 and a SiGe stressor layer 103a is formed on the P+ drain diffusion region 103. STI 14 is formed in the substrate 1 to electrically isolate the SiGe device 100.

In this embodiment, a plurality of SiGe-embedded dummy diffusion regions 32 and a plurality of dummy poly-Si patterns 34 are provided around the SiGe device 100. As best seen in FIG. 2, the SiGe-embedded dummy diffusion regions 32 and the dummy poly-Si patterns 34, which together encompass the SiGe device 100, are arranged in an alternate manner. However, any other arrangements make SiGe-embedded dummy diffusion regions 32 appear around the SiGe device 100 may also be used.

Referring to FIG. 3, to effectively counteract the micro-loading effect of SiGe growth, a dummy SiGe layer 32a is grown in each of the SiGe-embedded dummy diffusion regions 32. The dummy SiGe layer 32a is grown concurrently with the SiGe stressor layers 102a and 103a. As best seen in FIG. 3, the dummy poly-Si patterns 34 are situated directly above the STI 14 and do not overlap with the SiGe-embedded dummy diffusion regions 32.

As shown in FIG. 2 and FIG. 3, the plurality of SiGe-embedded dummy diffusion regions 32 and the plurality of dummy poly-Si patterns 34 are disposed within a middle annular region 300. The middle annular region 300 is between an inner region 200 and an outer region 400, wherein the SiGe device 100 is disposed within the inner region 200. A plurality of dummy poly-Si patterns 34 and a plurality of SiGe-free dummy diffusion regions 36 are provided in the outer region 400. The term "SiGe-free" refers to not containing SiGe herein. No SiGe is grown in the SiGe-free dummy diffusion regions 36. Likewise, the dummy poly-Si patterns 34 and the SiGe-free dummy diffusion regions 36 are arranged, but not limited to, in an alternate manner. Each dummy poly-Si pattern 34 is formed on the STI 14. Analogously, the dummy poly-Si pattern 34 does not overlap with the SiGe-free dummy diffusion region 36 in the outer region 400.

Figure 4:
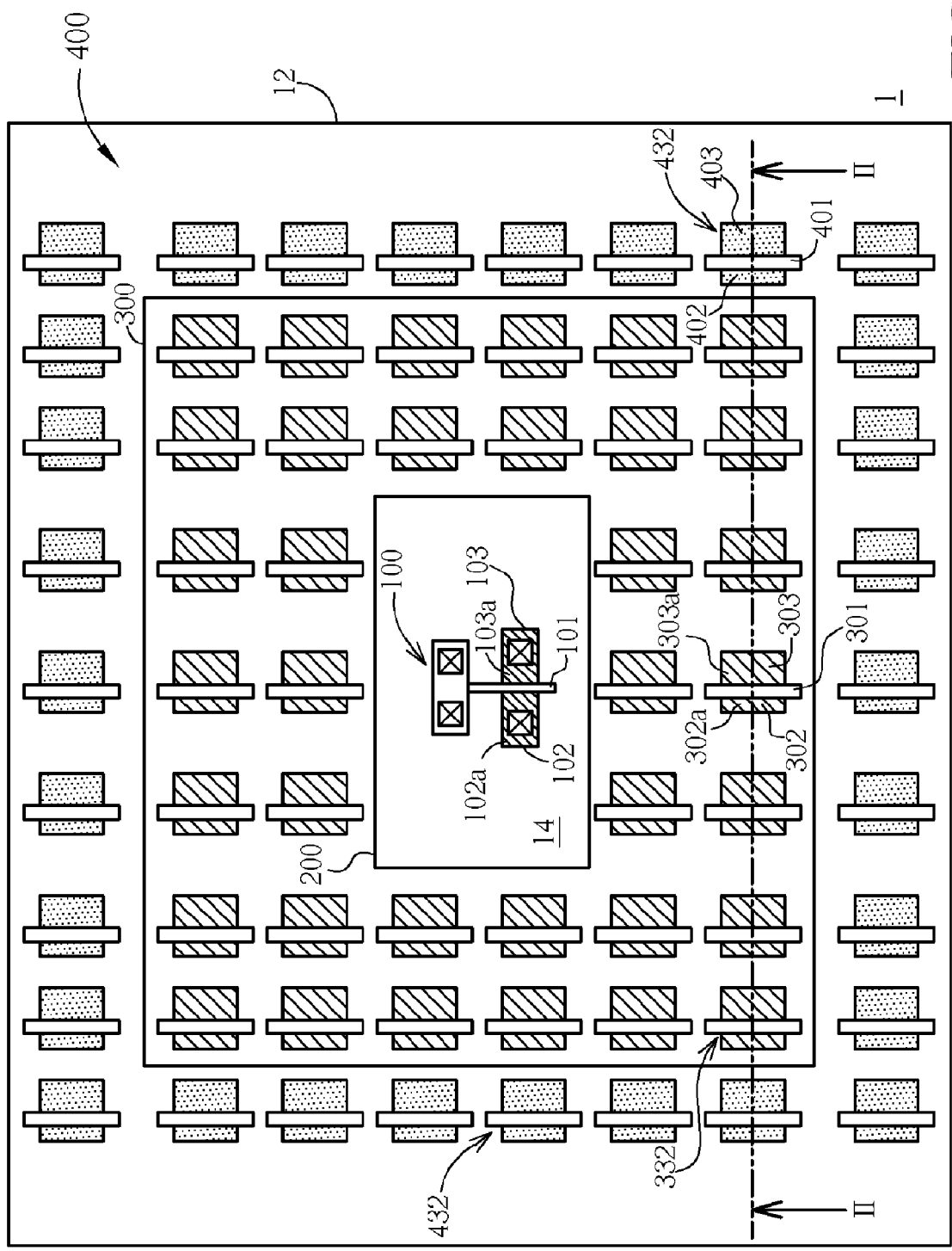
FIG. 4 is a schematic top view showing the layout of the SiGe device and SiGe-embedded dummy pattern in accordance with the third preferred embodiment of this invention.
Figure 5:
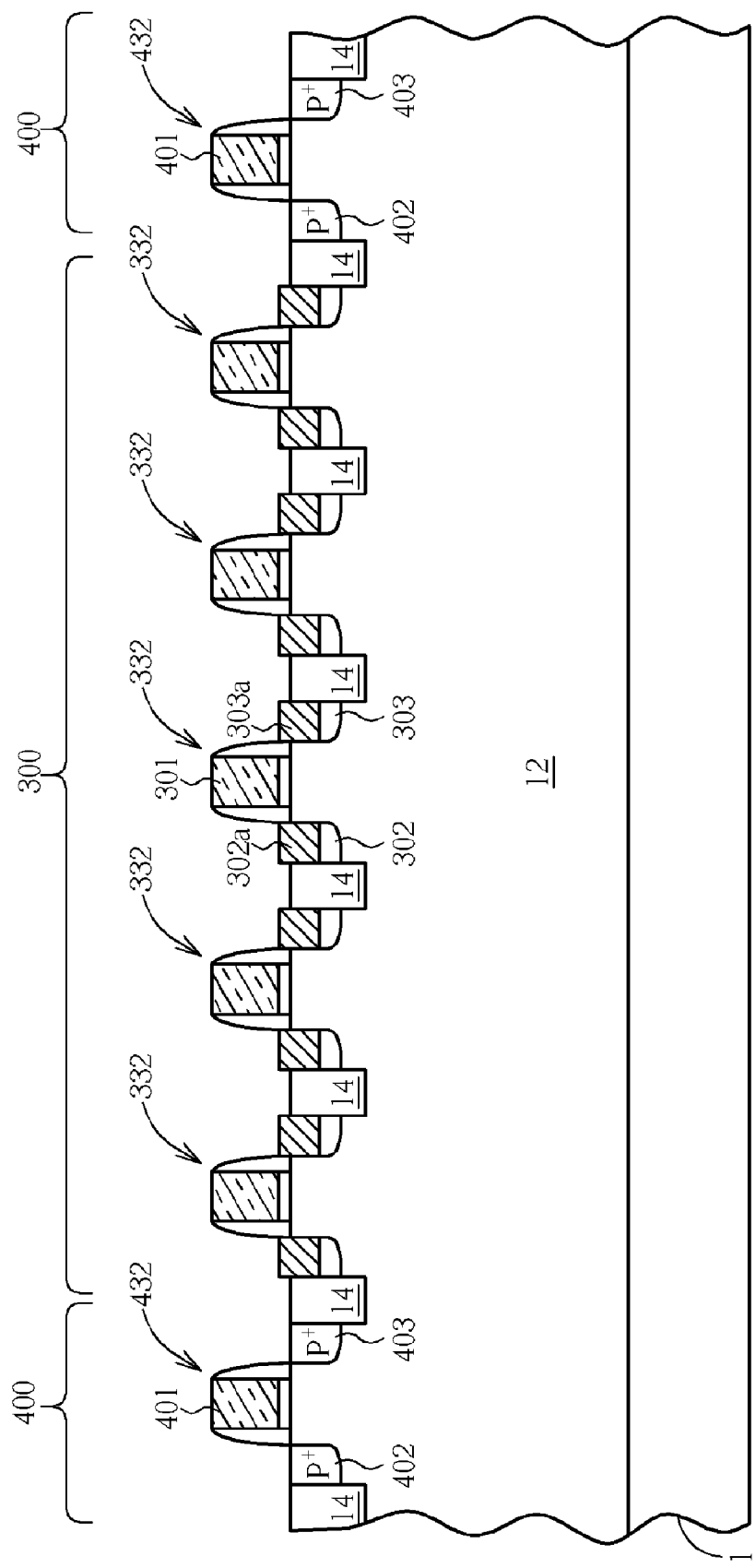
FIG. 5 is a cross-sectional view taken along line II-II of FIG. 4.

Please refer to FIG. 4 and FIG. 5. FIG. 4 is a schematic top view showing the layout of the SiGe device and SiGe-embedded dummy pattern in accordance with the third preferred embodiment of this invention, and FIG. 5 is a schematic, cross-sectional diagram taken along line II-II of FIG. 4. As shown in FIG. 4, a SiGe device 100 is formed in an N well 12 of a substrate 1. The substrate 1 may be a silicon substrate, SOI substrate or other suitable semiconductor substrates. According to the third preferred embodiment, the SiGe device 100 may include but not limited to a PMOS transistor and comprises a gate stack 101, a P+ source diffusion region 102, a P+ drain diffusion region 103, and a P channel between the P+ source diffusion region 102 and the P+ drain diffusion region 103. SiGe stressor layers 102a and 103a are formed on the P+ source diffusion region 102 and the P+ drain diffusion region 103, respectively. STI 14 is formed in the substrate 1 to electrically isolate the SiGe device 100.

According to the third preferred embodiment, a plurality of SiGe-embedded, cell-like dummy patterns 332 are disposed within the middle annular region 300, which is between the inner region 200 and the outer region 400. The SiGe device 100 is disposed within the inner region 200. A plurality of SiGe-free, cell-like dummy patterns 432 are disposed within the outer region 400.

In this embodiment, the SiGe-embedded, cell-like dummy patterns 332 are fabricated concurrently with the SiGe device 100. Therefore, each of the SiGe-embedded, cell-like dummy patterns 332 may have the same structure as that of the SiGe device 100 except that no contact is formed on the SiGe-embedded, cell-like dummy patterns 332. That is, each of the SiGe-embedded, cell-like dummy patterns 332 has a dummy gate 301, a dummy P+ diffusion region 302 and a dummy P+ diffusion region 303. SiGe layers 302a and 303a are formed on the dummy P+ diffusion region 302 and the dummy P+ diffusion region 303, respectively.

Each of the SiGe-free, cell-like dummy patterns 432 disposed within the outer region 400 may have the same structure as that of the SiGe device 100 except the contact and the SiGe layer. As best seen in FIG. 5, each of the SiGe-free, cell-like dummy patterns 432 has a dummy gate 401, a dummy P+ diffusion region 402 and a dummy P+ diffusion region 403. No SiGe layers are formed on the dummy P+ diffusion region 402 and the dummy P+ diffusion region 403.

Figure 6:
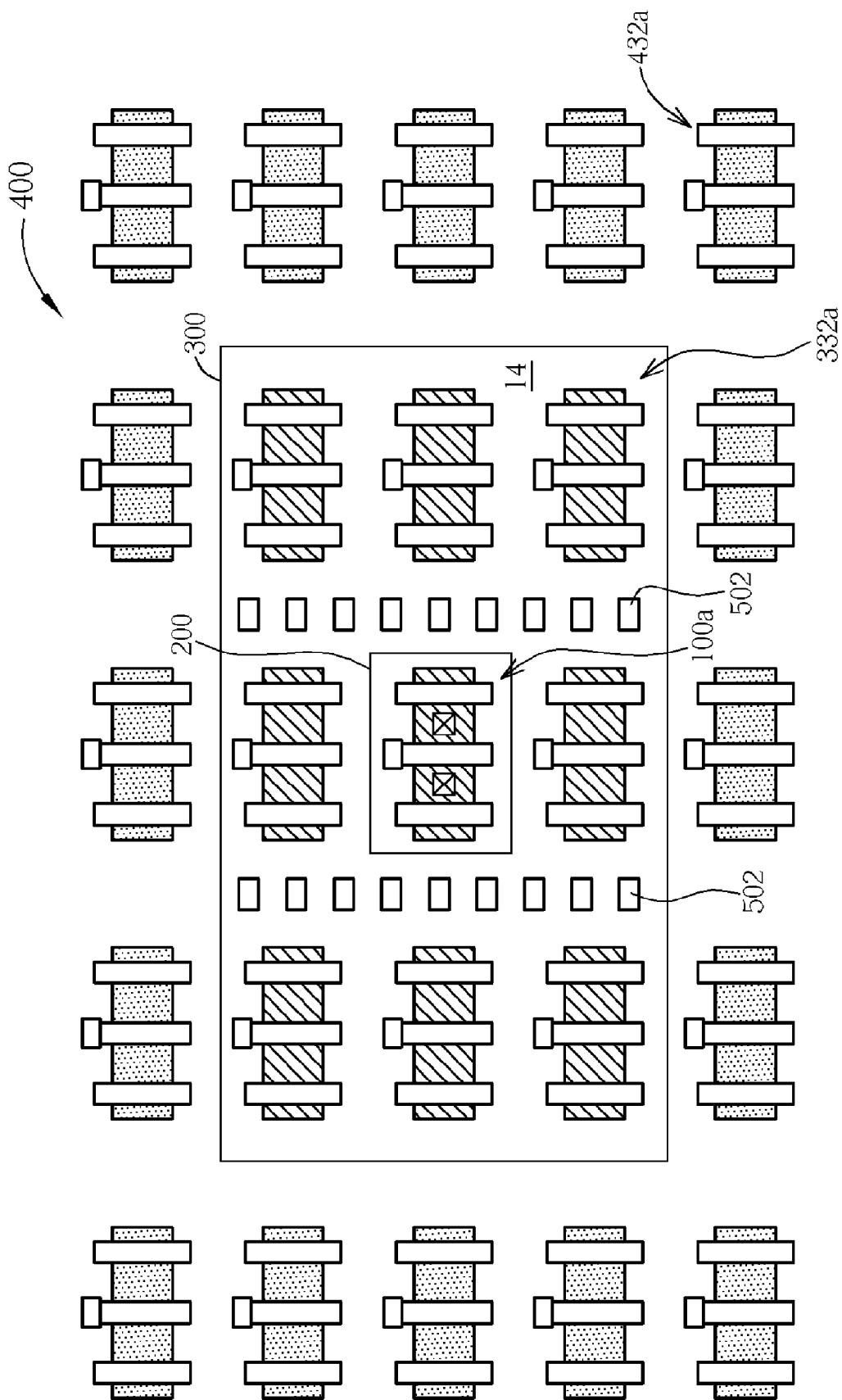
FIG. 6 is a schematic top view showing the layout of the SiGe device and SiGe-embedded dummy pattern in accordance with the fourth preferred embodiment of this invention.

FIG. 6 is a schematic top view showing the layout of the SiGe device and SiGe-embedded dummy pattern in accordance with the fourth preferred embodiment of this invention. As shown in FIG. 6, a SiGe device 100a is formed in an inner region 200. A plurality of SiGe-embedded, cell-like dummy patterns 332a are formed in the middle annular region 300 that surrounds the inner region 200. A plurality of SiGe-free, cell-like dummy patterns 432a are formed in the outer region 400.

The SiGe-embedded, cell-like dummy patterns 332a may be fabricated concurrently with the SiGe device 100a. Therefore, each of the SiGe-embedded, cell-like dummy patterns 332a may have the same structure as that of the SiGe device 100a except that no contact is formed on the SiGe-embedded, cell-like dummy patterns 332a. Each of the SiGe-free, cell-like dummy patterns 432a disposed within the outer region 400 may have the same structure as that of the SiGe device 100a except the contact and the SiGe layer.

One germane feature of the fourth preferred embodiment as set forth in FIG. 6 is that a plurality of poly-Si dummy patterns 502 are added in the middle annular region 300. In this embodiment, these poly-Si dummy patterns 502 are disposed on the STI 14 and situated between the SiGe-embedded, cell-like dummy patterns 332*a*. By adding these poly-Si dummy patterns 502, the poly-Si critical dimension (CD) can be improved.

Those skilled in the art will readily observe that numerous modifications and alterations of the device and method may be made while retaining the teachings of the invention.

What is claimed is:

1. A semiconductor device with dummy patterns for alleviating micro-loading effect, comprising:
   a semiconductor substrate having thereon a middle annular region between an inner region and an outer region;
   a SiGe device on the semiconductor substrate within the inner region;
   a plurality of first dummy patterns provided on the semiconductor substrate within the middle annular region, wherein at least one of the first dummy patterns contains SiGe; and
   a plurality of second dummy patterns provided on the semiconductor within the outer region, wherein the second dummy patterns do not contain SiGe.

2. A semiconductor device with dummy patterns for alleviating micro-loading effect, comprising:
   a semiconductor substrate having thereon a middle annular region between an inner region and an outer region;
   a SiGe device on the semiconductor substrate within the inner region; and
   a plurality of first dummy patterns provided on the semiconductor substrate within the middle annular region, wherein at least one of the first dummy patterns contains SiGe;
   wherein the plurality of first dummy patterns comprise dummy poly silicon patterns and SiGe-embedded dummy diffusion regions, and wherein the dummy poly silicon patterns and the SiGe-embedded dummy diffusion regions are arranged in an alternate manner within the middle annular region.

3. The semiconductor device with dummy patterns for alleviating micro-loading effect according to claim 2, wherein the dummy poly silicon pattern does not overlap with the SiGe-embedded dummy diffusion region.

4. A semiconductor device with dummy patterns for alleviating micro-loading effect, comprising:
   a semiconductor substrate having thereon a middle annular region between an inner region and an outer region;
   a SiGe device on the semiconductor substrate within the inner region; and
   a plurality of first dummy patterns provided on the semiconductor substrate within the middle annular region, wherein at least one of the first dummy patterns contains SiGe;
   wherein the SiGe device is a P-channel metal-oxide-semiconductor (PMOS) transistor.

5. A semiconductor device with dummy patterns for alleviating micro-loading effect, comprising:
   a semiconductor substrate having thereon a middle annular region between an inner region and an outer region;
   a SiGe device on the semiconductor substrate within the inner region; and
   a plurality of first dummy patterns provided on the semiconductor substrate within the middle annular region, wherein at least one of the first dummy patterns contains SiGe;
   wherein the SiGe device functions as a circuit component of mixed-signal circuits, RF circuits or analog circuits.

6. A semiconductor device, comprising:
   a semiconductor substrate having thereon a middle annular region between an inner region and an outer region;
   a SiGe device on the semiconductor substrate within the inner region;
   a plurality of SiGe-embedded, cell-like dummy patterns provided on the semiconductor substrate within the middle annular region, wherein each of the SiGe-embedded, cell-like dummy patterns has substantially the same structure as that of the SiGe device; and
   a plurality of SiGe-free, cell-like dummy patterns in the outer region.

7. The semiconductor device according to claim 6, wherein the SiGe device is electrically isolated by shallow trench isolation (STI).

8. The semiconductor device according to claim 6, wherein the SiGe device is a P-channel metal-oxide-semiconductor (PMOS) transistor.

9. The semiconductor device according to claim 8, wherein the SiGe device comprises a gate stack, a P+ source diffusion region, a P+ drain diffusion region, and a P channel between the P+ source diffusion region and the P+ drain diffusion region.

10. The semiconductor device according to claim 9, wherein a SiGe stressor layer is formed on the P+ source diffusion region and the P+ drain diffusion region.

11. The semiconductor device according to claim 6, wherein each of the SiGe-embedded, cell-like dummy pattern comprises a dummy gate, a dummy P+ diffusion region and a dummy P+ diffusion region, and wherein a SiGe layer is formed on the dummy P+ diffusion region and the dummy P+ diffusion region.

12. The semiconductor device according to claim 6, wherein the SiGe device functions as a circuit component of mixed-signal circuits, RF circuits or analog circuits.

13. The semiconductor device according to claim 6, wherein the semiconductor substrate comprises a silicon substrate.

* * * * *